United States Patent
Kim et al.

(10) Patent No.: US 7,035,133 B2
(45) Date of Patent: *Apr. 25, 2006

(54) SRAM-COMPATIBLE MEMORY DEVICE PERFORMING REFRESH OPERATION HAVING SEPARATE FETCHING AND WRITING OPERATION PERIODS AND METHOD OF DRIVING THE SAME

(75) Inventors: Gi Hong Kim, Suwon-si (KR); Sun Hyoung Lee, Seoul (KR)

(73) Assignee: Silicon7 Inc., (KR)

( * ) Notice: Subject to any disclaimer, the term of this patent is extended or adjusted under 35 U.S.C. 154(b) by 73 days.

This patent is subject to a terminal disclaimer.

(21) Appl. No.: 10/788,913

(22) Filed: Feb. 27, 2004

(65) Prior Publication Data

US 2004/0228165 A1  Nov. 18, 2004

(30) Foreign Application Priority Data

May 16, 2003 (KR) .................. 10-2003-0031095

(51) Int. Cl.
- *G11C 11/406* (2006.01)
- *G11C 11/401* (2006.01)
- *G11C 11/4063* (2006.01)
- *G11C 11/41* (2006.01)

(52) U.S. Cl. .................. 365/154; 365/149; 365/222

(58) Field of Classification Search .............. 365/154, 365/149, 222, 194, 205, 230.03
See application file for complete search history.

(56) References Cited

U.S. PATENT DOCUMENTS

| | | | | | |
|---|---|---|---|---|---|
| 6,028,804 | A | * | 2/2000 | Leung | 365/222 |
| 6,392,958 | B1 | * | 5/2002 | Lee | 365/233.5 |
| 6,809,979 | B1 | * | 10/2004 | Tang | 365/222 |
| 2002/0067632 | A1 | * | 6/2002 | Batson et al. | 365/49 |
| 2004/0233758 | A1 | * | 11/2004 | Kim et al. | 365/222 |

* cited by examiner

Primary Examiner—Van Thu Nguyen
Assistant Examiner—J. H. Hur
(74) Attorney, Agent, or Firm—Cantor Colburn LLP

(57) ABSTRACT

An SRAM-compatible memory device performs a refresh operation with separate fetching and rewriting operation periods.The SRAM-conpatible memory device can be activated by a method of driving the SRAM-compatible memory device. During a first refresh period, the SRAM-compatible memory device performs an operation of fetching data from a DRAM cell to be refreshed. During a second refresh period, the SRAM-compatible memory device performs an operation of rewriting the data fetched during the first refresh period in the refreshed DRAM cell. Accordingly, the length of an assigned refresh period is reduced, and the length of an entire external access period is also reduced.

16 Claims, 13 Drawing Sheets

SRAM-COMPATIBLE MEMORY DEVICE PERFORMING REFRESH OPERATION HAVING SEPARATE FETCHING AND WRITING OPERATION PERIODS AND METHOD OF DRIVING THE SAME

BACKGROUND OF THE INVENTION

1. Field of the Invention

The present invention relates generally to semiconductor memory devices and, more particularly, to a memory device which has dynamic random access memory cells and is compatible with a static random access memory, and a method of driving the same.

2. Description of the Related Art

Generally, random access memory (RAM) is classified into static random access memory (SRAM) and dynamic random access memory (DRAM). RAM typically includes a memory array composed of a plurality of unit memory cells arranged in a matrix form defined by rows and columns, and peripheral circuits adapted to control the input/output of data to/from the unit memory cells. Each of the unit memory cells, which are used in an SRAM to store one bit of data, is implemented with four transistors that form a latch structure, and two transistors that act as transmission gates. In SRAM, since data is stored in unit memory cells each having the latch structure, a refresh operation is not required to maintain the stored data. Further, SRAM has the advantages of a faster operating speed and lower power consumption compared to DRAM.

However, since the unit memory cells of SRAM is each composed of six transistors, SRAM is disadvantageous in that it requires a large wafer area compared to DRAM, in which each unit memory cell is implemented with a transistor and a capacitor. In more detail, in order to manufacture a semiconductor memory device of the same capacity, SRAM requires a wafer area about six to ten times that of DRAM. Such necessity of a large wafer area increases the unit cost of SRAM. When DRAM instead of SRAM is used to reduce costs, however, a DRAM controller is additionally required to perform a periodic refresh operation. Accordingly, the entire performance of a system using DRAM is deteriorated due to the time required to perform the refresh operation and a slower operating speed.

In order to overcome the disadvantages of DRAM and SRAM, there have been developments in SRAM-compatible memory which is externally compatible with SRAM while internally exploiting DRAM cells. FIG. 1 is a graphical view for explaining a method of driving a conventional SRAM-compatible memory. Referring to FIG. 1, a single 'external access period (EXT-TRC)' includes an internal access period' and a 'refresh period (REF-RW)'.

However, in the conventional SRAM-compatible memory driving method, operations of fetching data stored in a refreshed DRAM cell, transmitting the cell data to a sense amplifier, amplifying the cell data, and then rewriting the cell data in a refreshed DRAM cell are performed within a single 'refresh period (REF-RW)'.

Therefore, the conventional SRAM-compatible memory and its driving method have problems such that the refresh period REF-RW requires relatively large amount of time, so that the entire operating time is decreased.

SUMMARY OF THE INVENTION

Accordingly, the present invention has been made keeping in mind the above problems occurring in the prior art, and an object of the present invention is to provide an SRAM-compatible memory device and a method of driving the same, which improve the entire operating speed of a system employing the SRAM-compatible memory device by reducing the length of a refresh period.

In accordance with one aspect of the present invention, the above and other objects can be accomplished by the provision of an SRAM-compatible memory device including a memory block having DRAM cells arranged in a matrix form defined by rows and columns and require a refresh operation within a predetermined refresh period to allow data stored therein to remain valid. The SRAM-compatible memory is capable of externally interfacing with an external system, in which no timing period is provided for performing the refresh operation of the DRAM cells. The SRAM-compatible memory device performs discontinuous first and second external access periods. During the first refresh period, the SRAM-compatible memory device performs an operation of fetching data from a DRAM cell to be refreshed. During the second refresh period, the SRAM-compatible memory device performs an operation of rewriting the data fetched during the first refresh period in the refreshed DRAM cell.

In accordance with another aspect of the present invention, the above and other objects can be accomplished by the provision of a method of driving the SRAM-compatible memory. The SRAM-compatible memory performs externally accessed first and second external access periods, the first external access period including a first refresh period and a first internal access period and the second external access period including a second refresh period. The SRAM-compatible memory driving method comprises the steps of a) fetching data to be refreshed from a DRAM cell in a first row of the first memory block and storing the fetched data in the first sense amplifier during the first refresh period; b) storing the data fetched from the DRAM cell in the first row of the first memory block and stored in the first sense amplifier in the second sense amplifier; c) storing data accessed from a DRAM cell in a second row of the first memory block in the first sense amplifier during the first internal access period; and d) rewriting the data stored in the second sense amplifier in the DRAM cell in the first row of the first memory block during the second refresh period.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE INVENTION

Figure 1:
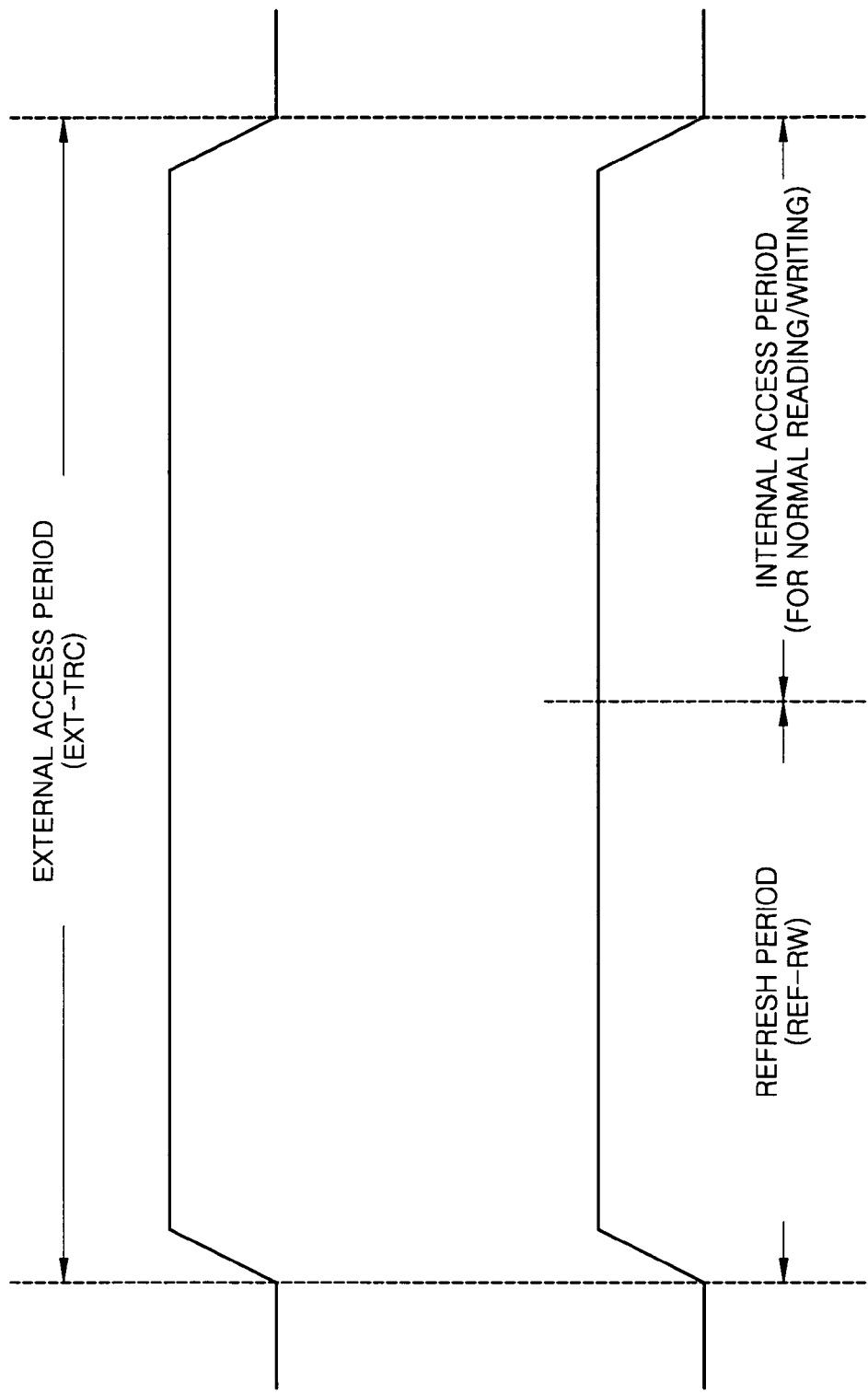
FIG. 1 is a graphical view for describing a method of driving a conventional SRAM-compatible memory device.

Reference now should be made to the drawings, in which the same reference numerals are used throughout the different drawings to designate the same or equivalent components.

An SRAM-compatible memory device according to the present invention employs DRAM cells and performs a refresh operation when seen from an internal standpoint, but does not allocate an operational range to the refresh operation when seen from an external standpoint. Additionally, the SRAM-compatible memory device does not require an external control signal for controlling a refresh operation. The SRAM-compatible memory device of the present invention is operated in accordance with the rules compatible with those for general SRAM.

The SRAM-compatible memory device of the present invention has a single 'refresh period' and a single 'internal access period' within a single 'external access period'. In the present specification, the 'external access period' represents a minimum time period during which data read or write access commands, which may be continuously inputted, are validly executed. The 'internal access period' represents a minimum time period during which, after a single word line is activated, the same word line or another word line is activated and then data is validly accessed. Further, the 'refresh period' for a refresh operation represents the period obtained by subtracting the 'internal access period' from the 'external access period'.

Figure 2:
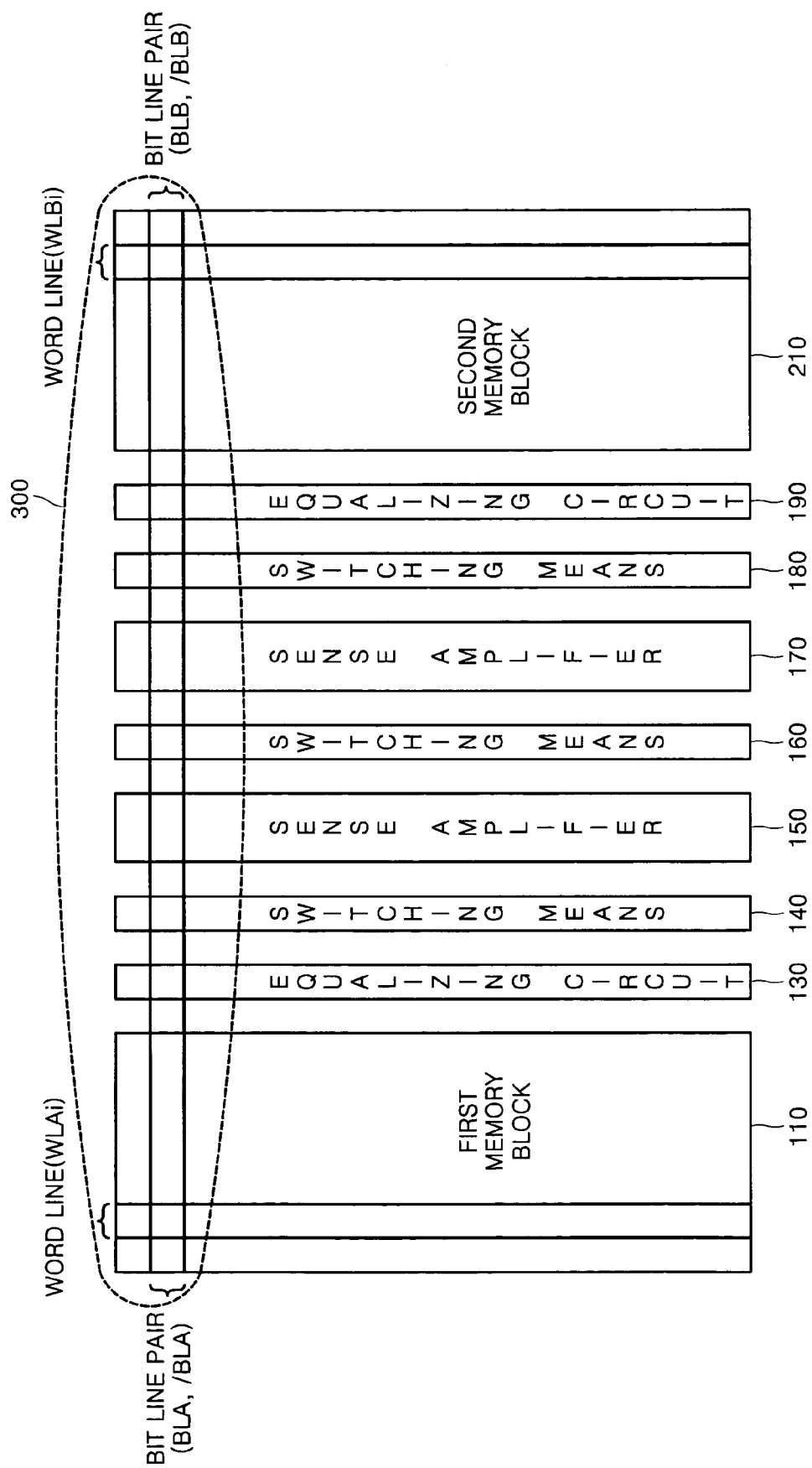
FIG. 2 is a schematic view showing an SRAM-compatible memory device according to an embodiment of the present invention.

FIG. 2 is a schematic view showing an SRAM-compatible memory device according to an embodiment of the present invention, in which two memory blocks 110 and 210 and circuit components arranged between the memory blocks 110 and 210 are schematically depicted. In FIG. 2, word lines of the first memory block 110 are designated as reference character WLAi (i=variable), and word lines of the second memory block 210 are designated as reference character WLBi (i=variable). Further, a pair of bit lines of the first memory block 110 are designated as reference characters BLA and /BLA, and a pair of bit lines of the second memory block 210 are designated as BLB and /BLB.

Figure 3:
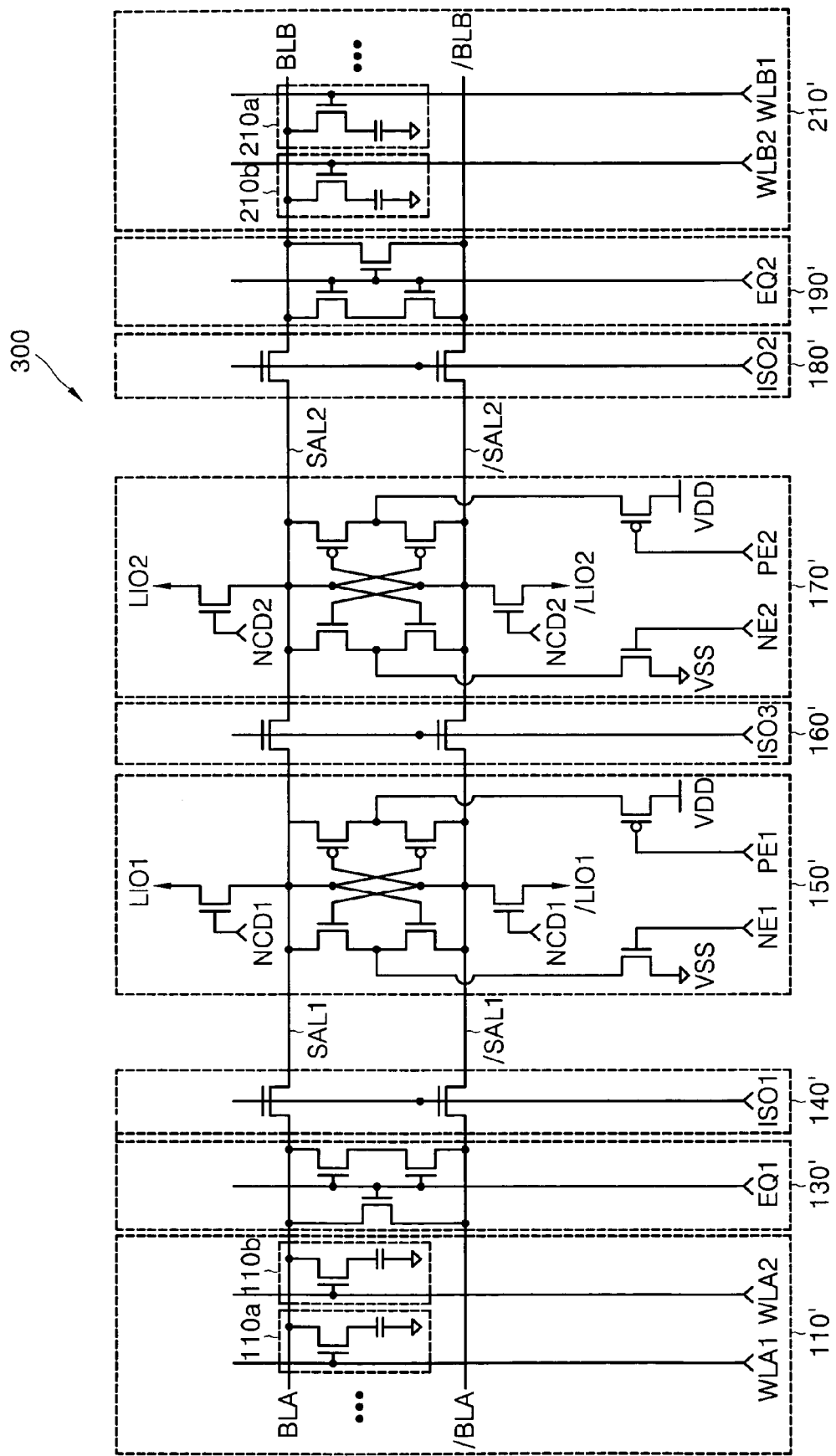
FIG. 3 is a detailed circuit diagram showing a part of the SRAM-compatible memory device in FIG. 2.

FIG. 3 is a detailed circuit diagram of a part 300 of the SRAM-compatible memory device in FIG. 2. In FIG. 3, the parts of the elements identical with those of FIG. 2 are represented by adding primes "'" to the reference numerals of the elements of FIG. 2.

With reference to FIG. 3, the SRAM-compatible memory device according to the embodiment of the present invention is described in detail. The first and second memory blocks 110' and 210' include a plurality of DRAM cells 110a, 110b, . . . and a plurality of DRAM cells 210a, 210b, . . . , respectively, which are arranged in a matrix form defined by rows and columns. In each of the DRAM cells 110a, 110b, . . . , 210a, 210b, . . . , the performance of a refresh operation within a predetermined refresh period is required in order for data written in the DRAM cells to remain valid. Each of the DRAM cells 110a, 110b, . . . , 210a, 210b, . . . includes a transmission transistor gated by a word line and a capacitor for storing therein data on a bit line transmitted through the transmission transistor.

Data written in the DRAM cells 110a, 110b, . . . of the first memory block 110' can be fetched through the first pair of bit lines BLA and /BLA, and data written in the DRAM cells 210a, 210b, . . . of the second memory block 210' can be fetched through the second pair of bit lines BLB and /BLB.

Figure 4:
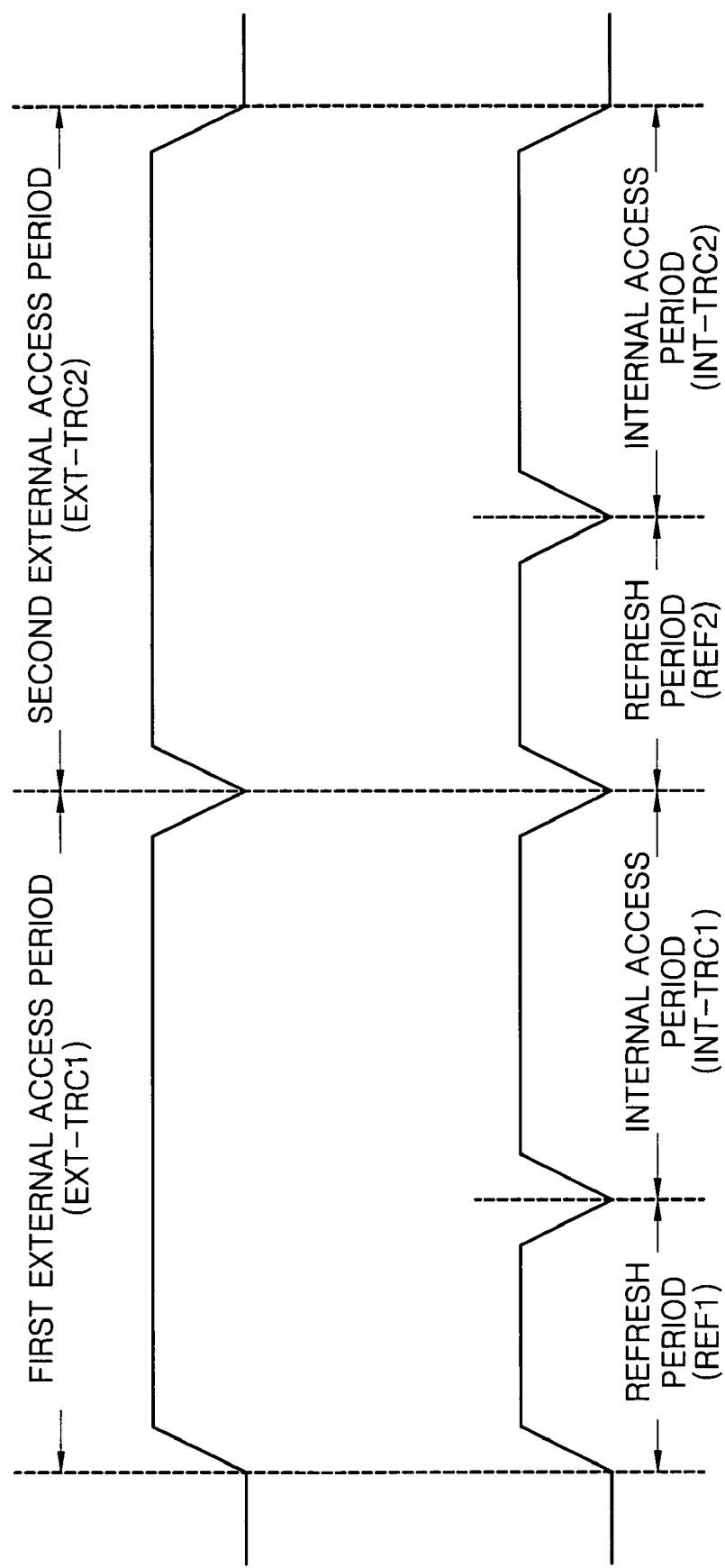
FIG. 4 is a graphical view for describing a method of driving the SRAM-compatible memory device in FIG. 3.

As shown in FIG. 4, the SRAM-compatible memory device of the present invention has first and second external access periods EXT-TRC1 and EXT-TRC2 in which the SRAM-compatible memory device is externally accessed. The first external access period EXT-TRC1 includes a first refresh period REF1 and a first internal access period INT-TRC1, and the second external access period EXT-TRC2 includes a second refresh period REF2 and a second internal access period INT-TRC2.

In accordance with a refresh operation in the SRAM-compatible memory device and a method of driving the SRAM-compatible memory device of the present invention, the reading of data from a DRAM cell to be refreshed is executed during the first refresh period REF1, and the rewriting of data into the DRAM cell to be refreshed is executed during the second refresh period REF2. The amplification of the refreshed data is performed during the first refresh period REF1 or the first internal access period INT-TRC1. Otherwise, the amplification of refreshed data may be performed before the rewriting of data during the second refresh period REF2.

Referring to FIG. 3, a first sense amplifier 150' includes a latch structure, which amplifies and latches data fetched from the DRAM cells 110a and 110b of the first memory block 110', or data to be written therein. A second sense amplifier 170' also includes a latch structure, which amplifies and latches data fetched from the DRAM cells 210a and 210b of the second memory block 210', or data to be written therein. In the present specification, an operation of fetching data from the DRAM cells or writing data in the DRAM cells is expressed as an operation of 'accessing the DRAM cells'.

A first switching unit 140' controls the electrical connection between the data input/output lines BLA and /BLA of the first memory block 110' and data lines SAL1 and /SAL1 of the first sense amplifier 150'. A second switching unit 180' controls the electrical connection between the data input/output lines BLB and /BLB of the second memory block 210' and data lines SAL2 and /SAL2 of the second sense amplifier 170'.

Further, a third switching unit 160' controls the electrical connection between the data lines SAL1 and /SAL1 of the first sense amplifier 150' and the data lines SAL2 and /SAL2 of the second sense amplifier 170'. Further, first and second equalizing circuits 130' and 190' function to equalize the data input/output lines BLA and /BLA of the first memory block 110' and the data input/output lines BLB and /BLB of the second memory block 210', respectively. The refresh operation in the SRAM-compatible memory device of the present invention is described in detail below.

Figure 5:
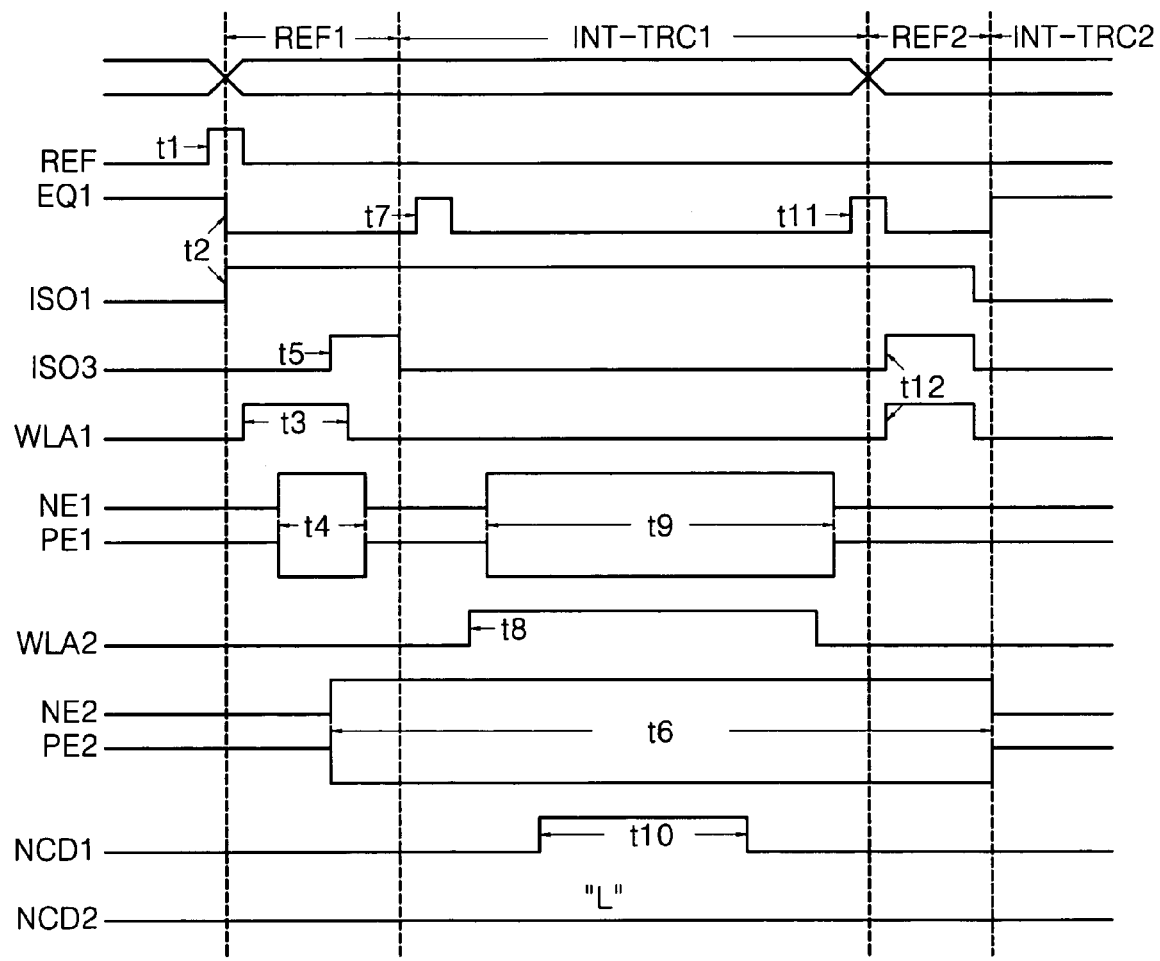
FIG. 5 is a timing diagram of signals of the SRAM-compatible memory device in FIG. 3 according to an embodiment of the present invention.

FIG. 5 is a timing diagram of signals of the SRAM-compatible memory device in FIG. 3 according to an embodiment of the present invention. In this embodiment, after data is fetched from a DRAM cell in a specific row during a refresh period, data is read-accessed from a DRAM cell in another row of the same memory block during an internal access period. In other words, referring to FIGS. 3 and 4, data is fetched from the DRAM cell 110a connected to the first word line WLA1 of the first memory block 110' during the first refresh period REF1, and data is read from the DRAM cell 110b connected to the second word line WLA2 of the first memory block 110' during the first internal access period INT-TRC1.

Referring to FIGS. 3 and 5, the first refresh period REF1 starts in response to a refresh request signal REF generated at time t1. A first equalization signal EQ1 is inactivated to "low" and a first switching signal IS01 is activated to "high" at time t2. Therefore, the equalization of the first pair of bit lines BLA and /BLA is released, and the first switching unit 140' is turned on, so that the first pair of bit lines BLA and /BLA are electrically connected to the data lines SAL1 and /SAL1 of the first sense amplifier 150', respectively. Further, when the first word line WLA1 is activated to "high" at time t3, data is fetched from the DRAM cell 110a of the first memory block 110'. When signals NE1 and PE1 are activated to "high" and "low", respectively, at time t4, the first sense amplifier 150' is operated to amplify the data fetched from the DRAM cell 110a.

Subsequently, at time t5, when there is an input address for selecting a DRAM cell in another row of the memory block 110, such as the DRAM cell 110b, connected to the second word line WLA2, a third switching signal IS03 is activated. Therefore, the data fetched from the DRAM cell 110a and latched in the first sense amplifier 150', is transmitted to the second sense amplifier 170' through the third switching unit 160'. When signals NE2 and PE2 are activated to "high" and "low", respectively, at time t6, the data fetched from the DRAM cell 110a and transmitted to the second sense amplifier 170' is amplified again.

The first equalization signal EQ1 is activated again at time t7, so that the first pair of bit lines BLA and /BLA are equalized. Thereafter, when the second word line WLA2 is activated at time t8, data is fetched from the DRAM cell 110b and transmitted to the first sense amplifier 150'. When the signals NE1 and PE1 are activated again to "high" and "low", respectively, at time t9, the data fetched from the DRAM cell 110b is amplified. Further, when a first output control signal NCD1 is transitioned to "high" at time t10, the data fetched from the DRAM cell 110b and stored in the first sense amplifier 150' is output through a first pair of local data lines Ll01 and /Ll01. At this time, a second output control signal NCD2 is kept inactivated to "low".

Thereafter, the first equalization signal EQ1 is activated again at time t11 when the second refresh period REF2 starts, so that the first pair of bit lines BLA and /BLA are equalized. Next, when the third switching signal IS03 and the first word line WLA1 are activated again at time t12, the data fetched from the DRAM cell 110a and stored in the second sense amplifier 170' is rewritten in the DRAM cell 110a.

Figure 6A:
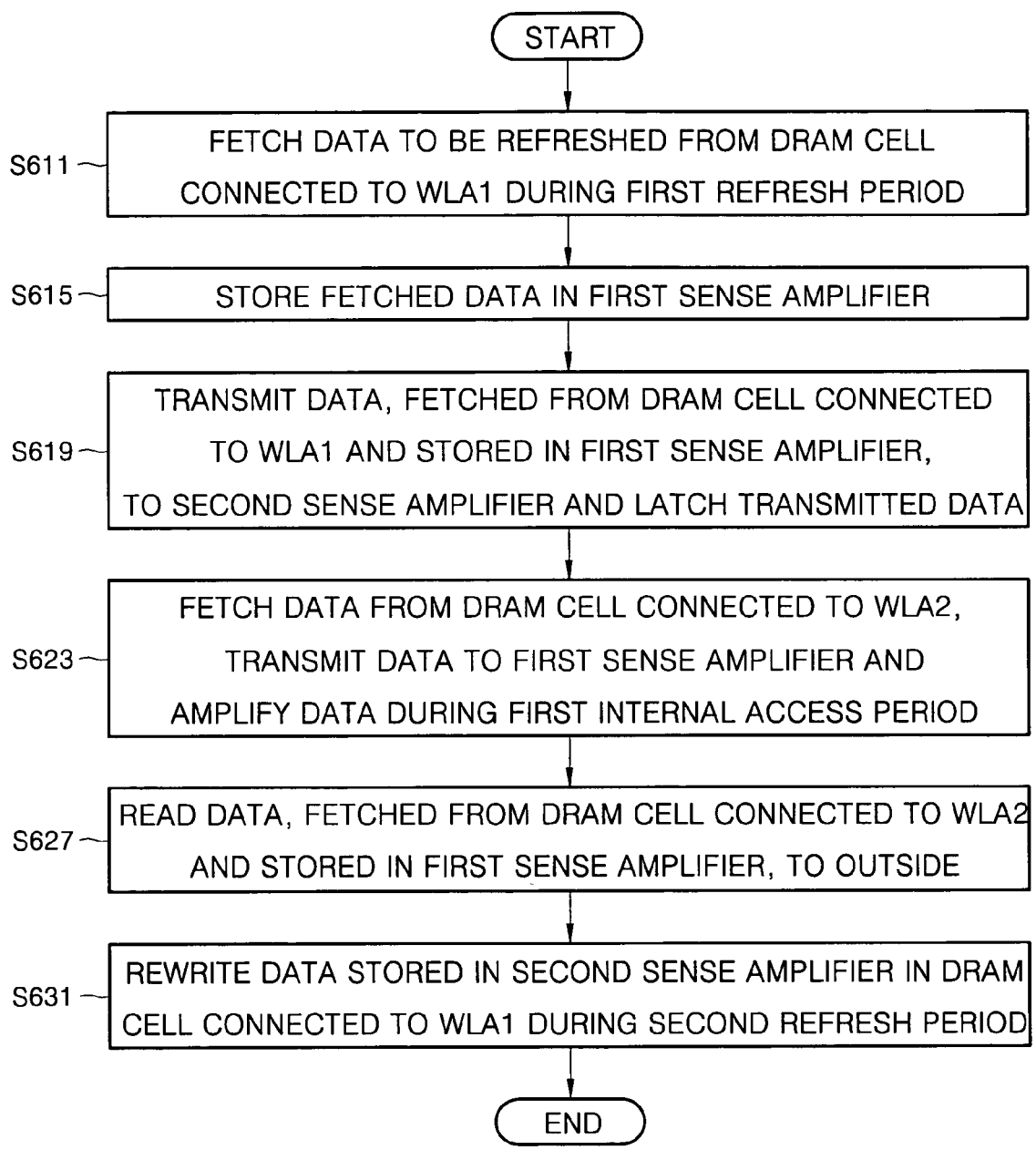
FIGS. 6A and 6B are flowcharts showing an operation of the SRAM-compatible memory device having the signals of the timing diagram in FIG. 5.

FIG. 6A is a flowchart showing an operation of the SRAM-compatible memory device having the signals of the timing diagram in FIG. 5. in this case, data is read out from a DRAM cell connected to a row (i.e., word line) of a memory block, while data is refreshed in another DRAM cell connected to another row of the same memory block.

Referring to FIGS. 3 and 6A, data to be refreshed is fetched from the DRAM cell 110a connected to the first word line WLA1 during the first refresh period REF1 at step S611. The fetched data is amplified by and stored in the first sense amplifier 150' at step S615. When an input external address is provided to specify another row of the same memory block 110', the data fetched from the DRAM cell 110a and stored in the first sense amplifier 150' is transmitted to the second sense amplifier 170' and latched therein at step S619. When the second word line WLA2 is activated, the data is fetched from the DRAM cell 110b specified by the external address. The fetched data is transmitted to the first sense amplifier 150' and then amplified thereby at step S623. Then, the data fetched from the DRAM cell 110b and stored in the first sense amplifier 150' is read to the outside of the first sense amplifier 150' at step S627. Subsequently, the data fetched from the DRAM cell 110a and stored in the second sense amplifier 170' is rewritten in the DRAM cell 110a during the second refresh period REF2 at step S631.

Figure 6B:
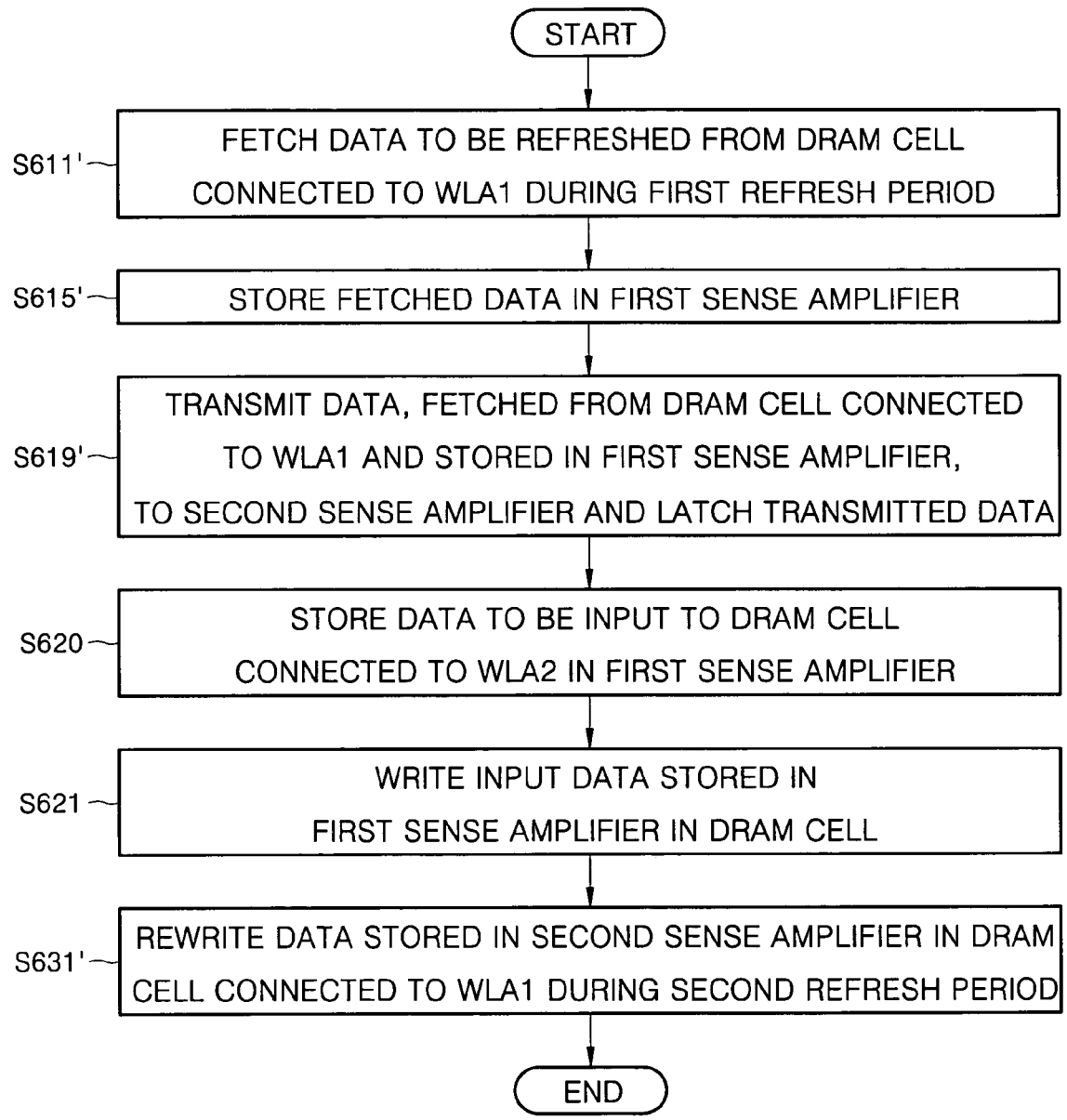

FIG. 6B is a flowchart showing an operation of the SRAM-compatible memory in which data is written in a DRAM cell connected to a row of a memory block, while data is refreshed in another DRAM cell connected to another row of the same memory block.

The flowchart of FIG. 6B is similar to that of FIG. 6A. Therefore, in FIG. 6B, steps identical with those of FIG. 6A are represented by adding primes "'" to the reference numerals of the steps of FIG. 6A. That is, steps S611', S615' and S619' of FIG. 6B are performed in the same manner as steps S611, S615 and S618 of FIG. 6A, so that a detailed description thereof is omitted in the present specification.

Subsequently, external input data is amplified by the first sense amplifier 150' and latched therein at step S620 of FIG. 6B. The input data stored in the first sense amplifier 150' is written in the DRAM cell 110b connected to the second word line WLA2 at step S621.

Then, the data, fetched from the DRAM cell 110a and stored in the second sense amplifier 170', is rewritten in the DRAM cell 110a during the second refresh period REF2 at step S631'.

Figure 7:
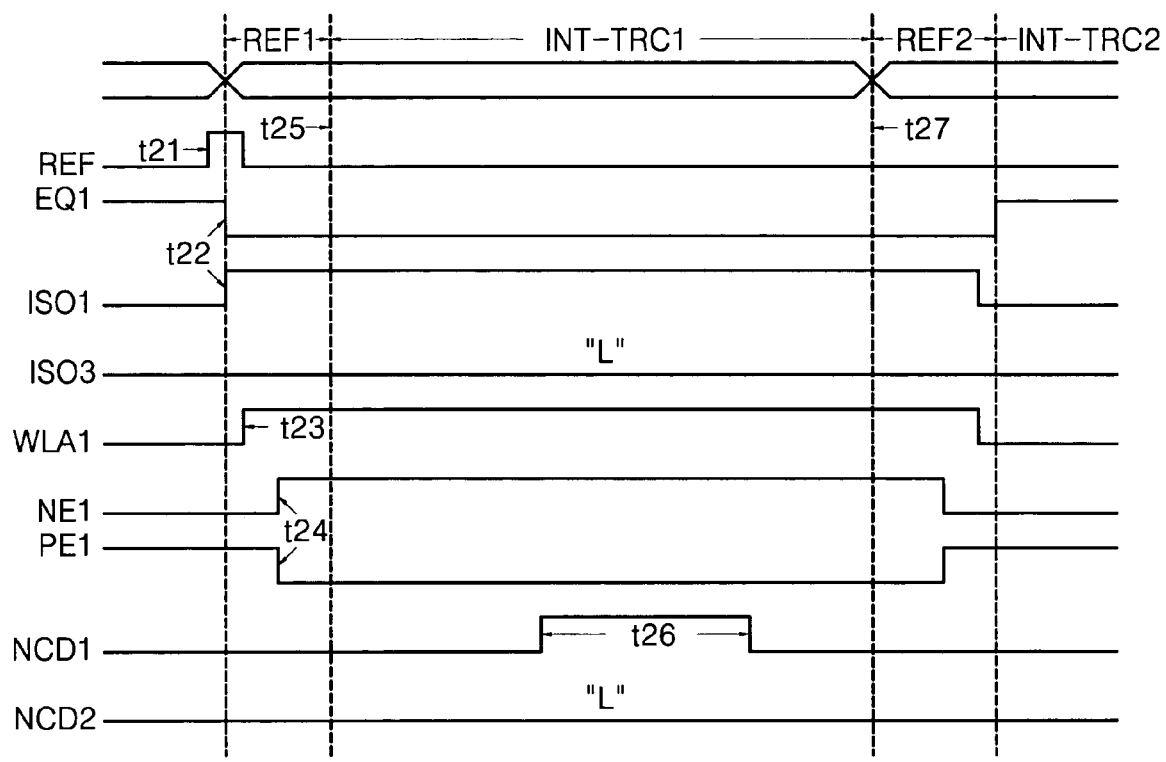
FIG. 7 is a timing diagram of signals of the SRAM-compatible memory device in FIG. 3 according to another embodiment of the present invention.

FIG. 7 is a timing diagram of signals of the SRAM-compatible memory device in FIG. 3 according to another embodiment of the present invention. In this embodiment, after data is fetched from a DRAM cell in a specific row during a refresh period, the data is read from the same DRAM cell in the same row of the same memory block during an internal access period.

Referring to FIGS. 3 and 7, the first refresh period REF1 starts in response to the refresh request signal REF generated at time t21. At time t22, the first equalization signal EQ1 is inactivated to "low" and the first switching signal IS01 is activated to "high", so that the equalization of the first pair of bit lines BLA and /BLA is released and the first switching unit 140' is turned on. Therefore, the first pair of bit lines BLA and /BLA are electrically connected to the data lines SAL1 and /SAL1 of the first sense amplifier 150', respectively. When the first word line WLA1 is activated to "high" at time t23, data is fetched from the DRAM cell 110a of the first memory block 110'. When the signals NE1 and PE1 are activated to "high" and "low", respectively, at time t24, the first sense amplifier 150' is operated to amplify the data fetched from the DRAM cell 110a.

Subsequently, the first internal access period INT-TRC1 starts at time t25. When the first output control signal NCD1 is "high" for time t26, the data fetched from the DRAM cell 110a and stored in the first sense amplifier 150' is output through the first pair of local data lines Ll01 and /Ll01. At this time, the second output control signal NCD2 is kept inactivated to "low". When the second refresh period REF2 starts at time t27, the data fetched from the DRAM cell 110a and amplified by the first sense amplifier 150' is rewritten in the DRAM cell 110a.

Figure 8A:
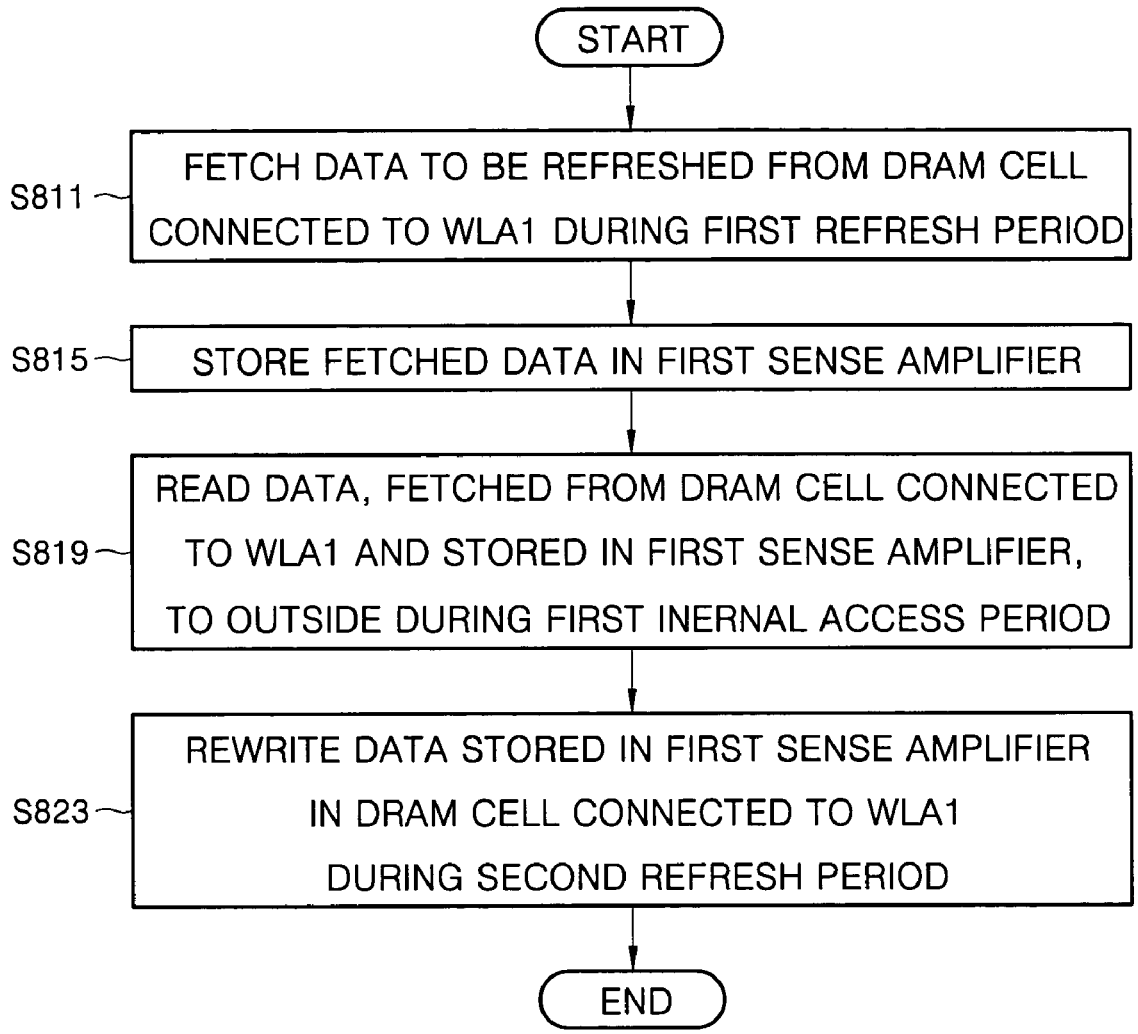
FIGS. 8a and 8b are flowcharts showing an operation of the SRAM-compatible memory device having the signals of the timing diagram in FIG. 7.

FIG. 8A is a flowchart showing an operation of the SRAM-compatible memory device having the signals of the timing diagram in FIG. 7, in which data is read from the same DRAM cell in a memory block as a refreshed DRAM cell in the same memory block.

Referring to FIGS. 3 and 8A, data to be refreshed is fetched from the DRAM cell 110a connected to the first word line WLA1 during the first refresh period REF1 at step S811. Further, the fetched data is amplified by and stored in the first sense amplifier 150' at step S815. Thereafter, the data fetched from the DRAM cell 110a and amplified by the first sense amplifier 150' is read to the outside of the first sense amplifier 150' during the first internal access period INT-TRC1 at step S819.

Subsequently, the data fetched from the DRAM cell 110a and stored in the first sense amplifier 150' is rewritten in the DRAM cell 110a during the second refresh period REF2 at step S823.

Figure 8B:
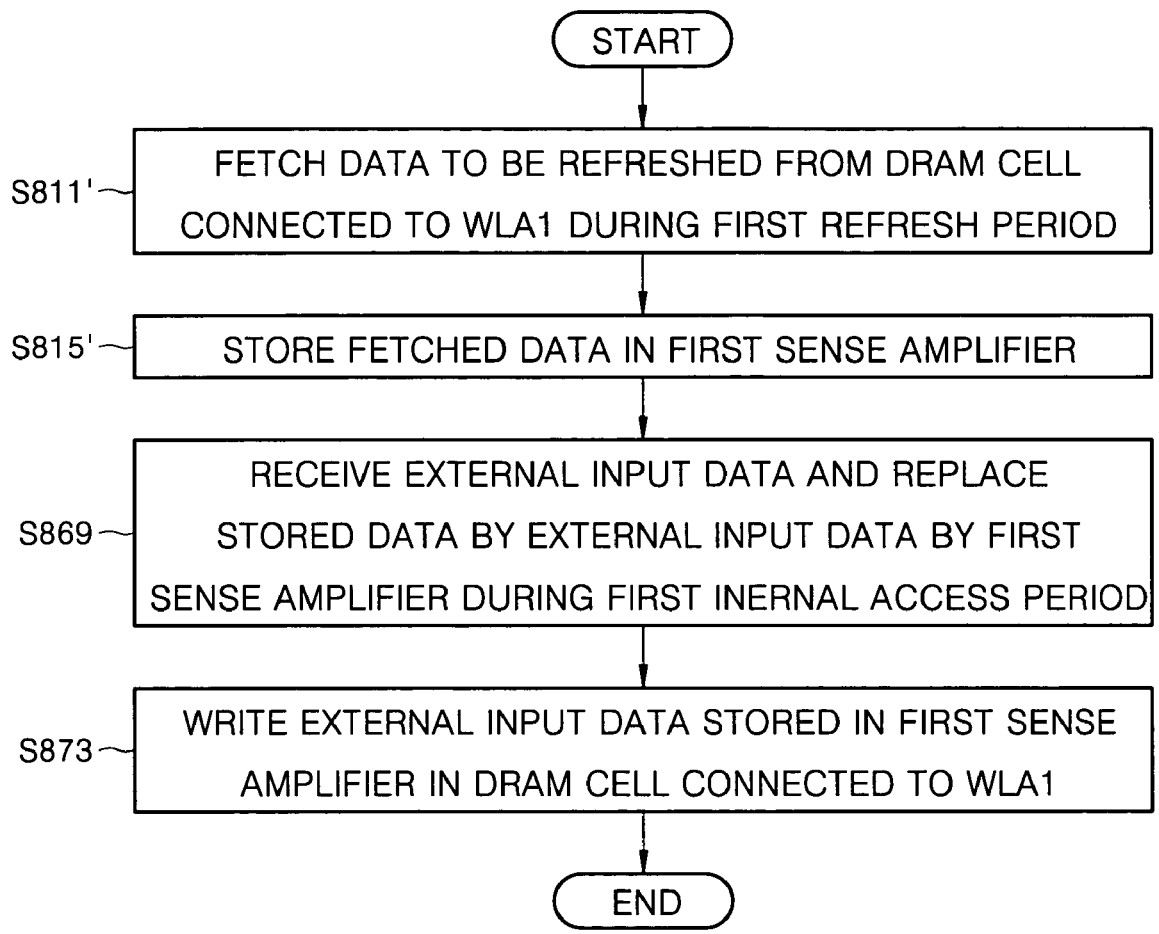

FIG. 8B is a flowchart showing an operation of the SRAM-compatible memory device in which data is written in the same DRAM cell in the same row of a memory block as a refreshed DRAM cell in the same memory block.

The flowchart of FIG. 8B is similar to that of FIG. 8A. Therefore, steps identical with those of FIG. 8A are represented by adding primes "'" to the reference numerals of the steps of FIG. 8A. That is, steps S811' and S815' of FIG. 8B are performed in the same manner as steps S811 and S815 of FIG. 8A, so that a detailed description thereof is omitted in the present specification.

Subsequently, the first sense amplifier 150' receives and stores external input data, and replaces data previously stored therein by the external input data during the first internal access period at step S869 of FIG. 8b. When the first word line WLA1 is activated during the second refresh period, the external input data stored in the first sense amplifier 150' is written in the DRAM cell 110a at step S873.

Figure 9:
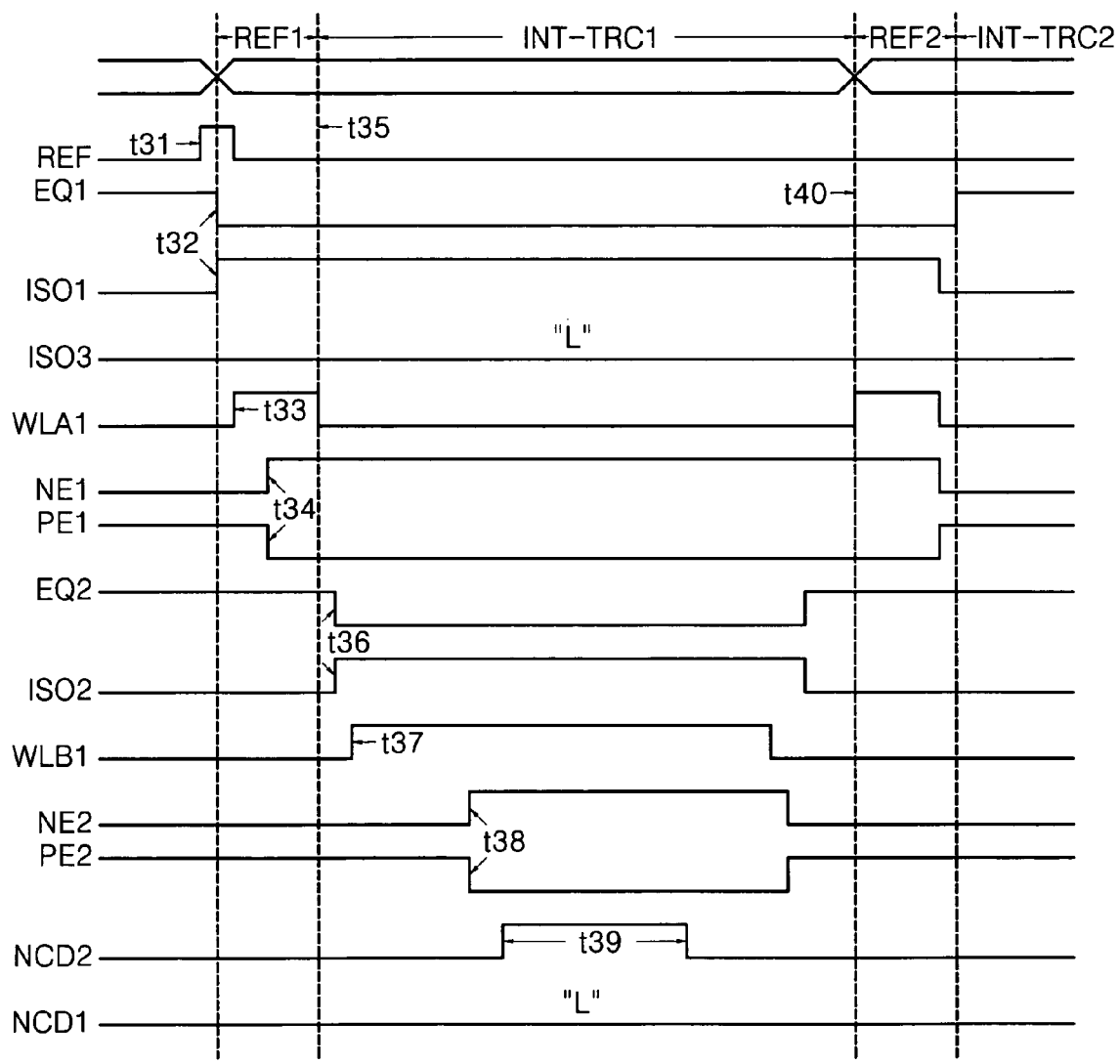
FIG. 9 is a timing diagram of signals of the SRAM-compatible memory device in FIG. 3 according to further another embodiment of the present invention.

FIG. 9 is a timing diagram of signals of the SRAM-compatible memory device in FIG. 3 according to further another embodiment of the present invention. In this embodiment, after data is fetched from a DRAM cell in a specific row of a specific memory block during a refresh period, data is read from a DRAM cell in another memory block during an internal access period. For example, data is fetched from the DRAM cell 110a connected to the first word line WLA1 of the first memory block 110' during the first refresh period REF 1, and data is read from the DRAM cell 210b connected to the first word line WLB1 of the second memory block 210' during the first internal access period INT-TRC1.

Referring to FIGS. 3 and 9, the first refresh period REF1 starts in response to the refresh request signal REF generated at time t31. At time t32, the first equalization signal EQ1 is inactivated to "low" and the first switching signal IS01 is activated to "high", so that the equalization of the first pair of bit lines BLA and /BLA is released and the first switching unit 140' is turned on. Therefore, the first pair of bit lines BLA and /BLA are electrically connected to the data lines SAL1 and /SAL1 of the first sense amplifier 150', respectively. When the first word line WLA1 is activated to "high" at time t33, data is fetched from the DRAM cell 110a in the first memory block 110'. When the signals NE1 and PE1 are activated to "high" and "low", respectively, at time t34, the first sense amplifier 150' is operated to amplify the data fetched from the DRAM cell 110a.

Subsequently, the first internal access period INT-TRC1 starts at time t35. At time t36, a second equalization signal EQ2 is inactivated to "low" and the second switching signal IS02 is activated to "high", so that the equalization of the second pair of bit lines BLB and /BLB is released and the second switching unit 180' is turned on. Therefore, the second pair of bit lines BLB and /BLB are electrically connected to the data lines SAL2 and /SAL2 of the second sense amplifier 170', respectively. When the word line WLB1 is activated to "high" at time t37, data is fetched from the DRAM cell 210a in the second memory block 210'. When the signals NE2 and PE2 are activated to "high" and "low", respectively, at time t38, the second sense amplifier 170' is operated to amplify the data fetched from the DRAM cell 210a.

When the second output control signal NCD2 is "high" for interval t39, the data fetched from the DRAM cell 210b and stored in the second sense amplifier 170' is output through a second pair of local data lines Ll02 and /Ll02. At this time, the first output control signal NCD1 is kept inactivated to "low". Thereafter, when the second refresh period REF2 starts at time t40, the first word line WLA1 is activated so that the data fetched from the DRAM cell 110a and stored in the first sense amplifier 150' is rewritten in the DRAM cell 110a.

Figure 10A:
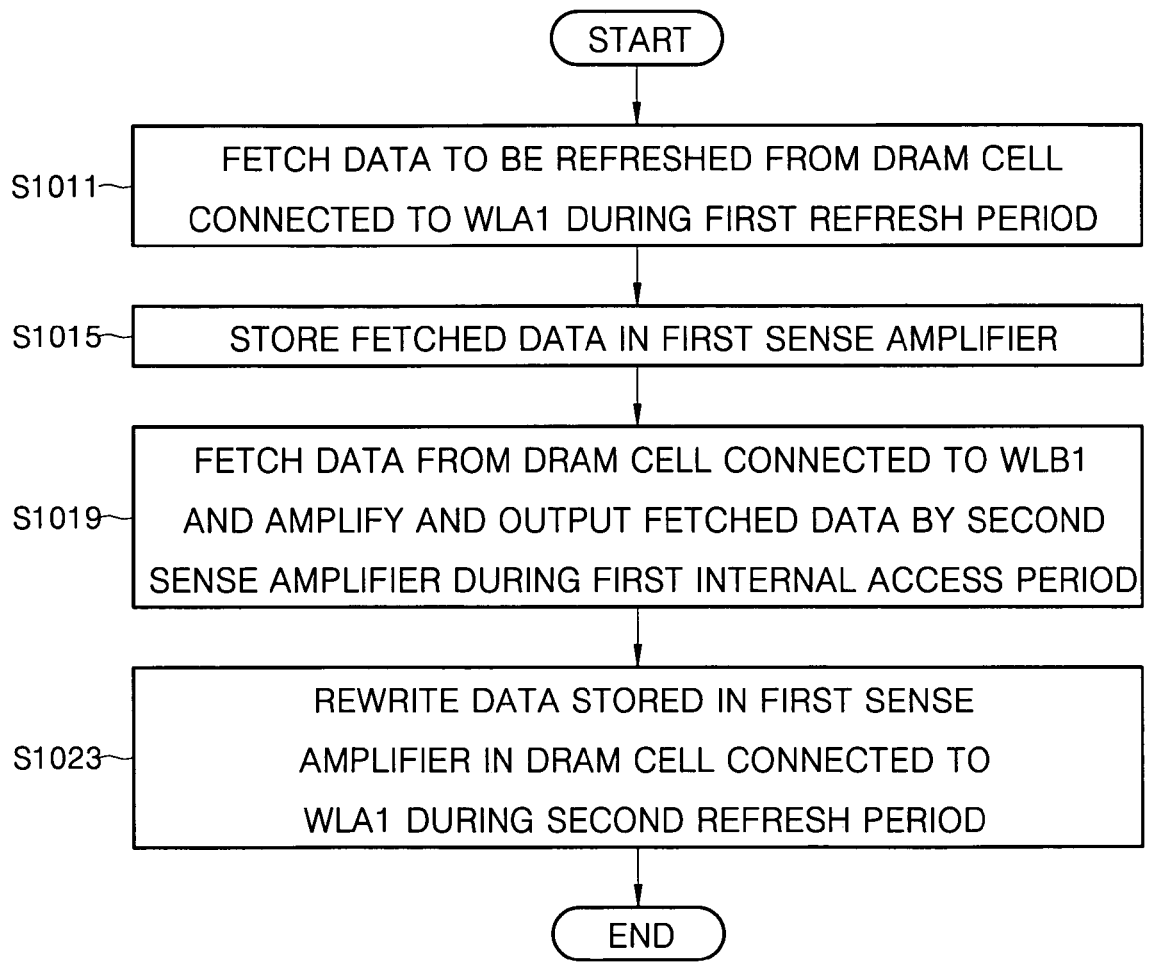
FIGS. 10a and 10b are flowcharts showing an operation of the SRAM-compatible memory device having the signals of the timing diagram in FIG. 9.

FIG. 10A is a flowchart showing an operation of the SRAM-compatible memory device having the signals of the timing diagram in FIG. 9, in which data is read from a DRAM cell in a memory block while data is refreshed in a DRAM cell of a different memory block.

Referring to FIG. 3 and 10A, data to be refreshed is fetched from the DRAM cell 110a connected to the first word line WLA1 during the first refresh period REF1 at step S1011. Further, the fetched data is amplified by and stored in the first sense amplifier 150' at step S1015. Then, during the first internal access period INT-TRC1, data is fetched from the DRAM cell 210a connected to the word line WLB1 of the second memory block 210', amplified by the second sense amplifier 170' and then output to the outside of the second sense amplifier 170' at step S1019.

Subsequently, the data, fetched from the DRAM cell 110a and amplified by the first sense amplifier 150', is rewritten in the DRAM cell 110a at step S1023.

Figure 10B:
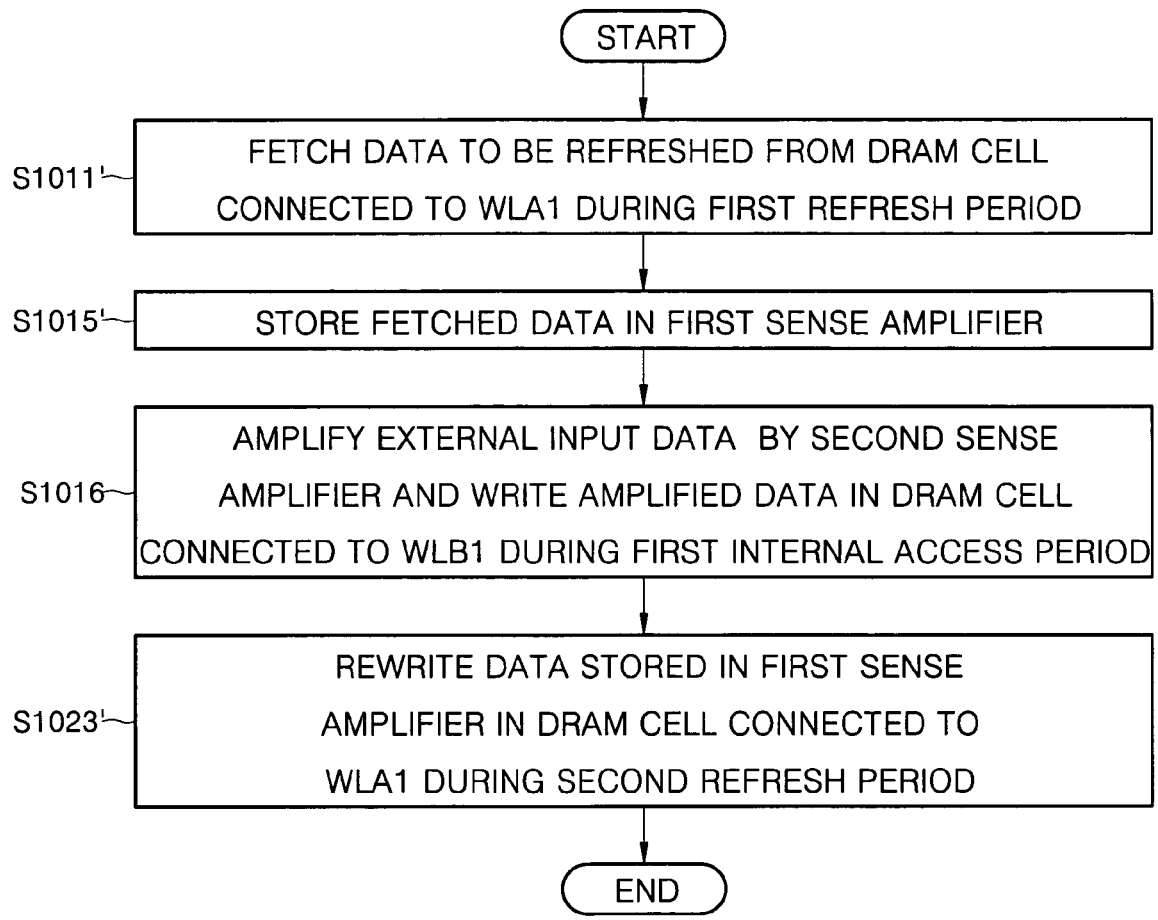

FIG. 10B is a flowchart showing an operation of the SRAM-compatible memory device, in which data is written into a DRAM cell in a memory block while data is refreshed in DRAM cell of a different memory block.

The flowchart of FIG. 10B is similar to that of FIG. 10A. Therefore, steps identical with those of FIG. 10A are represented by adding primes "'" to the reference numerals of the steps of FIG. 10A. That is, steps S1011' and S1015' of FIG. 10B are performed in the same manner as steps S1011 and S1015 of FIG. 10A, so that a detailed description thereof is omitted in the present specification.

Subsequently, external input data is amplified by the second sense amplifier 170' and written into the DRAM cell 210a connected to the word line WLB1 at step S1016. Then, if the word line WLA1 is activated during the second refresh period, the data fetched from the DRAM cell 110a and stored in the first sense amplifier 150' is rewritten into the DRAM cell 110a at step S1023' of FIG. 10B.

In accordance with the SRAM-compatible memory device and the method of driving the same according to the present invention, a single refresh period and a single internal access period are included in a single external access period. During the single refresh period, only an operation of fetching data to be refreshed or an operation of rewriting refreshed data is executed. Therefore, the SRAM-compatible memory and the method of driving the same of the present invention is advantageous in that the length of an assigned refresh period can be reduced, and the length of an entire external access period can be reduced, thus remarkably improving the entire operating speed of the SRAM-compatible memory device.

Although the exemplary embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of driving an SRAM-compatible memory including memory blocks and sense asnplifiers, the memory blocks each having DRAM cells arranged in a matrix form defined by rows and columns, the SRAM-compatible memory externally interfacing with an external system in which no timing period for performing a refresh operation is provided and first and second external access periods are provided for externally accessing the SRAM-compatible memory, the first external access period including a first refresh period and a first internal access period and the second external access period including a second refresh period, the method comprising the steps of:
   a) fetching data to be refreshed from a DRAM cell in a first row of a first memory block and storing the fetched data in a first sense amplifier during the first refresh period;
   b) storing the data fetched from the DRAM cell in the first row of the first memory block and stored in the first sense amplifier in a second sense amplifier;
   c) storing data accessed from a DRAM cell in a second row of the first memory block in the first sense amplifier during the first internal access period; and
   d) rewriting the data stored in the second sense amplifier in the DRAM cell in the first row of the first memory block during the second refresh period.

2. The method according to claim 1, further comprising the step of reading the data which is stored in the first sense amplifier in the step c) to an outside of the first sense amplifier.

3. The method according to claim 1, further comprising the step of writing the data which is stored in the first sense amplifier in the step c) in the DRAM cell in the second row of the first memory block.

4. The method according to claim 1, wherein the step b) is performed during the first refresh period.

5. The method according to claim 1, wherein the step b) is performed in response to an address signal for selecting the second row of the first memory block.

6. The method of claim 1. further comprising the step of:
   reading the data stored in the first sense amplifier to an outside of the first memory block during the first internal access period.

7. A method of driving an SRAM-compatible memory including memory blocks and sense amplifiers, the memory blocks each having DRAM cells arranged in a matrix form defined by rows and columns, (the SRAM-compatible memory externally interfacing with an external system in which no timing period for performing a refresh operation is provided and first and second external access periods are provided for externally accessing the SRAM-compatible memory, the first external access period including a first refresh period and a first internal access period and the second external access period including a second refresh period, the method comprising the steps of
   a) fetching first data to be refreshed from a DRAM cell in a first row of a first memory block and storing the fetched first data in a first sense amplifier during the first refresh period;
   b) fetching second data front a DRAM cell in a first row of a second memory block and storing the fetched second data in a second sense amplifier during the first internal access period; and
   c) rewriting the first data amplified by and stored in the first sense amplifier in the DRAM cell in the first row of the first memory block during the second refresh period.

8. The method according to claim 7, further comprising the step of reading the fetched second data which is stored in the second sense amplifier in the step b) to an outside of the second sense amplifier.

9. An SRAM-compatible memory device including DRAM cells arranged in a matrix form defined by rows and columns, and externally interfacing with an external system in which no timing period is provided for performing a refresh operation of the DRAM cells, the SRAM-compatible memory device comprising:
   first and second memory blocks each having the DRAM cells;
   a first sense amplifier for amplifying and latching data fetched from a DRAM cell in the first memory block;
   a second sense amplifier for amplifying and latching data fetched from a DRAM cell in the second memory block;
   a first switching unit for controlling an electrical connection of data input/output lines between the first memory block and the first sense amplifier,
   a second switching unit for controlling an electrical connection of data input/output lines between the second memory block and the second sense amplifier; and
   a third switching unit for controlling an electrical connection between the first and second sense amplifiers.

10. The SRAM-compatible memory device according to claim 9, farther comprising:
    a first equalizing unit for equalizing the data input/output lines of the first memory block; and
    a second equalizing unit for equalizing the data input/output lines of the second memory block.

11. The SRAM-compatible memory device according to claim 9, wherein first and second external access periods are provided for externally accessing the SRAM-compatible memory device, the first external access period including a first refresh period and a first internal access period and the second external access period including a second refresh period, the first switching unit transmitting data fetched from a DRAM cell in a first row of the first memory block to the first sense amplifier during the first refresh period.

12. The SRAM-compatible memory device according to claim 11, wherein the third switching unit transmits the data fetched from the DRAM cell in the frst row of the first memory block and stored in the first sense amplifier to the second sense amplifier during the first refresh period.

13. The SRAM-compatible memory device according to claim 12, wherein the data stored in the second sense amplifier is read out and rewritten in the DRAM cell in the first row of the first memory block during the second refresh period.

14. The SRAM-compatible memory device according to claim 9, wherein the first switching unit transmits data fetched from a DRAM cell in a second row of the first memory block to the first sense amplifier during the first internal access period.

15. An SRAM-compatible memory device including memory blocks each having DRAM cells arranged in a matrix form defined by rows and columns, and externally interfacing wit an external system in no timing period is provided for performing a refresh operation of the DRAM cells, the SRAM-compatible memory device comprising:

first and second memory blocks each having DRAM cells which are accessed by being specified by input addresses, access operations of the DRAM cells being independent of each other;

a first sense amplifier for amplifying and latching data fetched from an accessed DRAM cell in the first memory black during a normal access operation;

a second sense amplifier for amplifying and latching data fetched from an accessed DRAM cell in the second memory block during the normal access operation;

a first switching unit far controlling an electrical connection of data input/output lines between the first memory block and the first sense amplifier;

a second switching unit for controlling an electrical connection of data input/output lines between the second memory block and the second sense amplifier; and a third switching unit for controlling an electrical connection between the first and second sense amplifiers.

16. The SRAM-compatible memory device according to claim 15, wherein:

the SRAM-compatible memory device performs a predetermined external access operation during an external access period, the external access period including a refresh period and an internal access period in sequence;

the first switching unit transmits data fetched from a DRAM cell in a first raw of the first memory block to the first sense amplifier during the refresh period; and the third switching unit transmits the data fetched from the DRAM cell in the first row and stored in the first sense amplifier to the second sense amplifier and latches the transmitted data therein, when a DRAM cell in a second row of the first memory block is specified.

* * * * *